United States Patent
De Silva et al.

(10) Patent No.: US 11,307,496 B2
(45) Date of Patent: Apr. 19, 2022

(54) METAL BRUSH LAYER FOR EUV PATTERNING

(71) Applicant: INTERNATIONAL BUSINESS MACHINES CORPORATION, Armonk, NY (US)

(72) Inventors: Ekmini Anuja De Silva, Slingerlands, NY (US); Jing Guo, Niskayuna, NY (US); Jennifer Church, Troy, NY (US); Dario Goldfarb, Dobbs Ferry, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 111 days.

(21) Appl. No.: 16/688,657

(22) Filed: Nov. 19, 2019

(65) Prior Publication Data
US 2021/0149298 A1    May 20, 2021

(51) Int. Cl.
*G03F 7/004*    (2006.01)
*H01L 21/027*    (2006.01)

(52) U.S. Cl.
CPC ........ *G03F 7/0042* (2013.01); *H01L 21/0274* (2013.01)

(58) Field of Classification Search
CPC .................................................. G03F 7/0042
See application file for complete search history.

(56) References Cited

U.S. PATENT DOCUMENTS

| | | | |
|---|---|---|---|
| 8,143,571 B1 * | 3/2012 | Dyer | B01D 15/3861 250/281 |
| 9,389,511 B2 * | 7/2016 | Schwartz | H01L 21/027 |
| 9,632,408 B1 | 4/2017 | Cottle et al. | |
| 9,738,765 B2 | 8/2017 | Brink et al. | |
| 9,834,700 B2 | 12/2017 | Ellison et al. | |
| 9,927,706 B2 | 3/2018 | Nealey et al. | |
| 10,138,331 B2 * | 11/2018 | Li | C08K 9/06 |
| 10,157,740 B1 | 12/2018 | Ouyang et al. | |
| 10,345,702 B2 * | 7/2019 | Glodde | G03F 7/2006 |
| 10,647,829 B2 * | 5/2020 | Minagawa | B01D 15/38 |
| 10,831,102 B2 * | 11/2020 | De Silva | G03F 7/26 |
| 2008/0257015 A1 * | 10/2008 | Lukehart | C08F 2/38 73/31.05 |
| 2011/0091814 A1 * | 4/2011 | Endo | B41C 1/1008 430/302 |
| 2012/0231346 A1 * | 9/2012 | Tsujii | H01M 10/0565 429/306 |
| 2017/0152339 A1 | 6/2017 | Takahara et al. | |

(Continued)

OTHER PUBLICATIONS

Gajda-Schrantz et al., "Equilibrium and spectroscopic studies of diethyltin(IV) complexes formed with hydroxymono- and dicarboxylic acids and their thioanalogues", J. Chem. Soc., Dalton Trans, Dec. 2001, pp. 152-158.

(Continued)

*Primary Examiner* — Amanda C. Walke
(74) *Attorney, Agent, or Firm* — Tutunjian & Bitetto, P.C.; Abdy Raissinia

(57) ABSTRACT

A metal brush layer is provided. The metal brush layer includes a polymer backbone including at least one grafting unit, G, attached to the polymer backbone, and a plurality of metal-containing moieties, M, attached to the polymer backbone.

20 Claims, 8 Drawing Sheets

(56) References Cited

U.S. PATENT DOCUMENTS

2019/0064667 A1   2/2019  Glodde et al.

OTHER PUBLICATIONS

Guo et al., "Polymer brush as adhesion promoter for EUV patterning", Proc. of SPIE vol. 10586, Apr. 2018, pp. 1-13.
Seshadri et al., "Ultrathin EUV patterning stack using polymer brush as an adhesion promotion layer", Proc. of SPIE vol. 10143, Mar. 2017, pp. 1-11.

* cited by examiner

METAL BRUSH LAYER FOR EUV PATTERNING

BACKGROUND

The present invention generally relates to a metal brush layer for extreme ultra violet patterning, and more particularly to metal containing polymers for EUV lithography.

Extreme ultraviolet (EUV) lithography (EUVL) is being explored as a process for forming smaller features of electronic devices on semiconductors. EUV lithography can utilize light with a wavelength of about 13.5 nanometers (nm) to generate photoreactions in an EUV resist material on a substrate. The EUV resist can absorb a portion of the EUV light to produce photo-electrons and secondary electrons that increase the extent of the chemical reactions in the resist material. The photo-electrons and secondary electrons can result in a reduction of line resolution and/or an increase in line edge roughness (LER). At low photon doses the image quality can ultimately depend on the photon number due to stochastic effects. The number of photons for a defined energy dose in much less for EUV compared to 193 nm DUV lithography.

SUMMARY

In accordance with an embodiment of the present invention, a metal brush layer is provided. The metal brush layer includes a polymer backbone including at least one grafting unit, G, attached to the polymer backbone, and a plurality of metal-containing moieties, M, attached to the polymer backbone.

In accordance with another embodiment of the present invention, a metal brush layer is provided. The metal brush layer includes a polymer backbone including at least one grafting unit, G, attached to a terminal monomer of the polymer backbone. The metal brush layer further includes a plurality of metal-containing moieties, M, attached to the polymer backbone, and a plurality of first adhesion promotors, $A^1$, attached to the polymer backbone, wherein the plurality of adhesion promotors, A, occur as a first block along the polymer backbone, and the plurality of metal-containing moieties, M, occur as a second block along the polymer backbone.

In accordance with yet another embodiment of the present invention, an EUV lithography stack is provided. The EUV lithography stack includes a metal brush layer on a substrate, and a resist layer on the metal brush layer, wherein the metal brush layer includes a polymer backbone including at least one grafting unit, G, attached to the polymer backbone, and a plurality of metal-containing moieties, M, attached to the polymer backbone.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Figure 1:
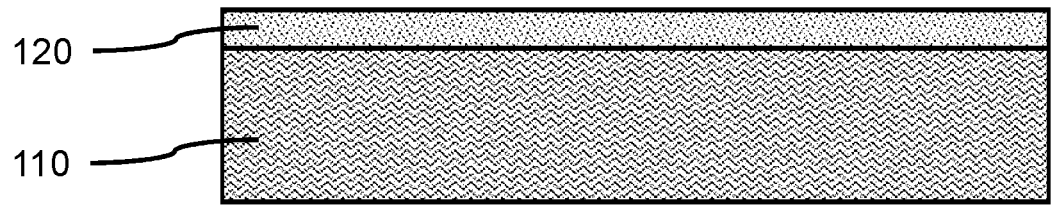
FIG. 1 is a cross-sectional side view showing a metal brush layer on a substrate, in accordance with an embodiment of the present invention.

Embodiments of the present invention provide a metal-containing polymer for extreme ultraviolet (EUV) lithography, where the metal-containing polymer forms a brush layer on a substrate. The metal-containing polymer can have a higher metal content and reduced thickness compared to prior materials, where the thickness can be less than 5 nanometers. The metal component of the polymer can increase the EUV absorption characteristics of the layer. The metal can be attached to a pendent group on the polymer or attached to the polymer backbone itself. The polymer metal brush layer can provide better control of the metal placement. Since the metal atoms are chemically grafted to the polymer brush layer, applying the polymer to the surface of the substrate can control the placement and location of the metal in the stack of lithography layers.

Embodiments of the present invention provide a metal resist and hard mask with high absorbance and enhanced extreme ultraviolet capture at the interface. The metal resist can be a polymer with a metal component on a pendent group of the polymer or on the polymer backbone. The metal brush layer can bind to an organic planarization layer (OPL) or a hardmask layer.

Embodiments of the present invention provide a metal resist that can be spun onto a surface, where the metal resist can be much thinner. A metal brush layer can have a thickness of about 2 nanometers (nm), whereas a metal hard mask can have a thickness of 10 nm or greater. Pattern transfer can be challenging with thick metal hardmask with a thickness greater than 10 nanometers (nm).

The metal binding groups on the polymer can be highly EUV absorbing, where the selected metals can have a high EUV absorption cross-section. Increasing the absorption in the EUV spectral range can be achieved by using elements with a higher absorption cross-section at about 92 eV grafted to the polymer brush layer. In various embodiments, the EUV absorbing element with a high EUV absorption cross-section can have an absorption cross-section of at least 15 megabarn (Mb) (i.e., $15 \times 10^{-22}$ m$^2$ or $1.5 \times 10^{-21}$ m$^2$). The EUV absorbing element can have semi-core levels of their electronic structure that are accessible to EUV radiation.

In various embodiments, the EUV absorbing element can be non-noble gas elements with a high EUV absorption cross sections, including, but not limited to, tellurium (Te), iodine (I), cesium (Cs), astatine (At), tin (Sn), antimony (Sb), indium (In), bismuth (Bi), and combinations thereof, although other elements with EUV absorption cross sections below 15 Mb (e.g., nickel (Ni): 7.5 Mb) are also contemplated. Transition metals and semiconductors with an EUV cross-section of about 5 Mb or greater can be used, for example, nickel (Ni), tungsten (W), iron (Fe), hafnium (Hf), gallium (Ga), arsenic (As), and palladium (Pd). A high EUV cross-section can be above the EUV cross-section of the atoms making up an organic polymer, including, carbon (C), nitrogen (N), oxygen (O), sulfur (S), fluorine (F), and chlorine (Cl). A high EUV cross-section can be above 15 Mb or above 10 Mb or above 5 Mb. In various embodiments, the EUV absorbing element(s) can be incorporated into the brush polymer using metal salts.

The nitrogen content of the polymer can be reduced to limit the affect of basic nitrogen moieties on acid quenching. Reducing the availability of unbonded electron pairs from nitrogen atoms can reduce the number of hydrogen ions scavenged by the polymer. The nitrogen content of the polymer can be reduced by not including, for example, amine and/or amide functional groups in the polymer other than nitrogens chelating with the bonded metal, since the nitrogen electron pairs are interacting with the metal, so not available to scavenge hydrogen.

Exemplary applications/uses to which the present invention can be applied include, but are not limited to: extreme ultraviolet lithography and EUV resists and hardmasks.

It is to be understood that aspects of the present invention will be described in terms of a given illustrative architecture; however, other architectures, structures, substrate materials and process features and steps can be varied within the scope of aspects of the present invention.

Referring now to the drawings in which like numerals represent the same or similar elements and initially to FIG. 1, a cross-sectional side view of a metal brush layer on a substrate is shown, in accordance with an embodiment of the present invention.

In one or more embodiments, a metal brush layer 120 can be formed on a substrate 110, where the metal brush layer 120 can be formed by a spin-on process. The metal brush layer 120 can be a polymeric material including metals that can act as EUV absorbing centers.

In one or more embodiments, the substrate 110 can include an organic planarization layer (OPL), where the OPL forms the exposed surface onto which the metal brush layer 120 is formed. The substrate 110 can also include a semiconductor substrate made of a semiconductor material, for example, a group IV semiconductor (e.g., silicon (Si), germanium (Ge), a IV-IV compound semiconductor (e.g., silicon-germanium (SiGe), silicon carbide (SiC), a III-V compound semiconductor (e.g., gallium arsenide (GaAs), indium phosphide (InP), etc.), and combinations thereof. The substrate 110 can include a single crystal semiconductor wafer onto which the organic planarization layer is formed.

In various embodiments, one or more semiconductor devices can be on the semiconductor portion of the substrate 110, where the semiconductor devices can be active devices (e.g., transistors, complementary metal-oxide-semiconductor devices (CMOS)), passive devices (e.g., resistors, capacitors, inductors), and combinations thereof (e.g., 1T1C memory cells). In various embodiments, the OPL can be formed on the semiconductor portion of the substrate 110 over the semiconductor devices.

In one or more embodiments, the OPL can have a thickness in a range of about 30 nm to about 300 nm, or about 40 nm to about 100 nm, although other thicknesses are also contemplated, where the OPL thickness can be great enough to perform the planarization over the underlying substrate as well as have enough thickness to enable pattern transfer.

In one or more embodiments, the metal brush layer 120 can be a polymeric material, where the polymeric material can be a graft copolymer, a block copolymer, or a random copolymer. The metal brush layer 120 can include a filler-adhesion promoter moiety, a photo-acid generator moiety, a metal-containing moiety, a solubility switch moiety, and a grafting unit. The metal brush layer 120 can provide a controlled metal concentration at the interface between the organic planarization layer (OPL) of a substrate 110 and an overlying resist layer. The metal brush layer 120 can provide increased adhesion between the OPL and an overlying resist layer, whereas a resist applied directly to the OPL may spontaneously delaminate (e.g., zero adhesion) or not have significant etch selectivity to enable pattern transfer.

In various embodiments, the metal brush layer 120 can have a thickness in a range of about 0.5 nm to about 10 nm, or about 0.5 nm to about 2 nm, or about 1 nm to about 2 nm, or about 1 nm to about 10 nm, where the thickness of the metal brush layer 120 can be sufficient to provide increased adhesion between the OPL and an overlying resist layer, provide increased photo-absorption at the interface between the OPL and an overlying resist layer, and enable subsequent pattern transfer to the underlying substrate 110.

In various embodiments, the metal brush layer 120 can be about 25% to about 45%, or about 30% to about 40% metal by weight.

In various embodiments, the polymer backbone of the metal brush layer 120 forming a graft copolymer can be poly vinyl alcohol [CHCHOH]$_x$, poly vinyl acetate [CHCHOCOCH$_3$]$_x$, poly 4-vinylphenol [CHCH(C$_6$H$_4$OH)]$_x$, poly methyl methacrylate [CHC(CH$_3$)(COOCH$_3$)]x, and combinations thereof. The vinyl group can undergo polymerization, and the moieties grafted onto the backbone of the metal brush layer 120 can react with the alcohol oxygen or carboxyl carbon to attach to the polymer backbone, for example, through a condensation reaction such as esterification.

In various embodiments, the polymer backbone of the metal brush layer 120 forming a block or random copolymer can be formed by a vinyl group bonded to the pendent moiety.

Figure 2:
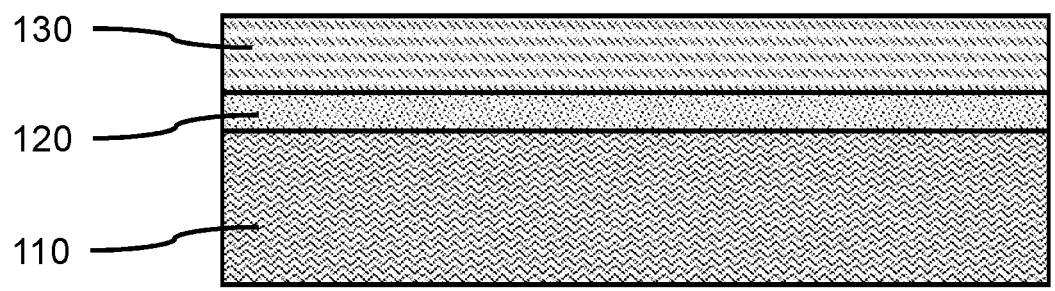
FIG. 2 is a cross-sectional side view showing a resist layer on the metal brush layer, in accordance with an embodiment of the present invention.

FIG. 2 is a cross-sectional side view showing a resist layer on the metal brush layer, in accordance with an embodiment of the present invention.

In one or more embodiments, a resist layer 130 can be formed on the metal brush layer 120, where the resist layer 130 can be formed on the metal brush layer by a spin-on process. In various embodiments, the resist layer 130 can be a polymeric material that is photo-sensitive to EUV light in a wavelength range of about 13.5 nm. The resist layer 130 can also include metals that absorb the EUV light. The resist layer 130 can be chemically amplified or not chemically amplified. The metal brush layer 120 on the substrate 110 and the resist layer 130 on the metal brush layer can form an EUV lithography stack.

Figure 3:
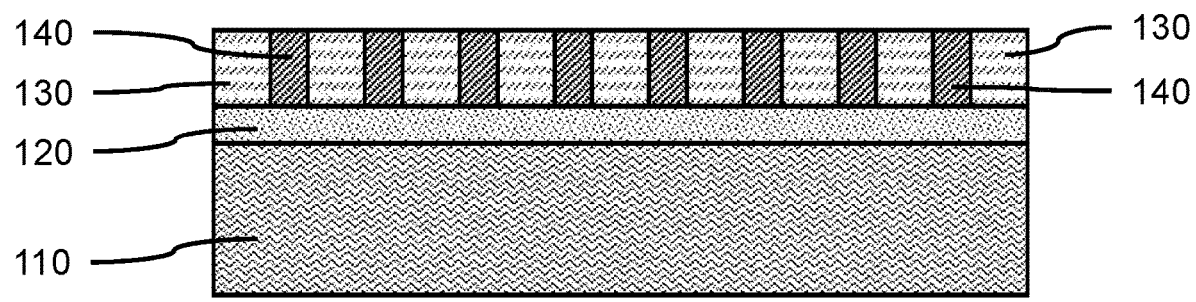
FIG. 3 is a cross-sectional side view showing the resist layer exposed to an extreme ultraviolet (EUV) light source to cause a photoreaction in the resist material, in accordance with an embodiment of the present invention.

FIG. 3 is a cross-sectional side view showing the resist layer exposed to an extreme ultraviolet (EUV) light source to cause a photoreaction in the resist material, in accordance with an embodiment of the present invention.

In one or more embodiments, the resist layer 130 and underlying metal brush layer 120 can be exposed to EUV radiation reflected from an EUV photomask. The EUV radiation can be 13.5 nm. Exposure to the EUV radiation can cause photo-reactions in the resist layer 130. The resist layer 130 can be a positive tone resist material, where exposure to the EUV radiation changes the chemical structure of the resist material so that it becomes more soluble in the developer, or a negative tone resist material, where exposure to the EUV radiation causes the resist material to become crosslinked/polymerized and more difficult to dissolve in developer. The figures depict a non-limiting exemplary embodiments of a negative tone resist, which should not be construed as a limitation or a suggestion of a preference.

In various embodiments, exposure to EUV radiation can form masking elements 140 from the resist layer 130, where the masking elements 140 can be insoluble features formed on the underlying metal brush layer 120. In other embodiments, the exposure to EUV radiation can cause exposed portions of the resist layer 130 to become soluble, leaving behind masking elements 140 on the underlying metal brush layer 120 after developing. The masking elements 140 can form a pattern on the underlying metal brush layer 120.

In various embodiments, the masking elements 140 can have a width in a range of about 5 nm to about 25 nm, or about 10 nm to about 20 nm, although other widths are also contemplated.

In various embodiments, while not intending to be bound by theory, the increased EUV photon absorption within the metal brush layer 120 at the interface of the substrate 110 and resist 130 can increase the number of electrons that can take part in the resist solubility switching chemistry. The increased number of secondary electrons can help mitigate the resist defects such as nanobridge formation which occurs due to insufficient reaction at the interface.

Figure 4:
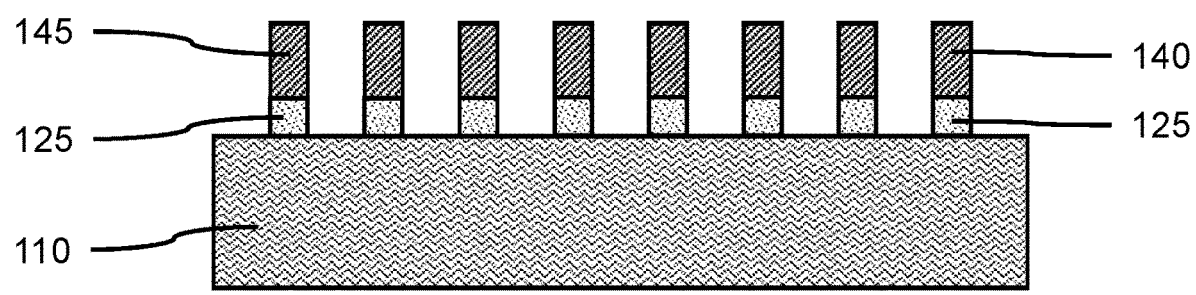
FIG. 4 is a cross-sectional side view showing the patterned resist layer developed to leave the masking elements on the metal brush layer, and the pattern transferred to the metal brush layer, in accordance with an embodiment of the present invention.

FIG. 4 is a cross-sectional side view showing the patterned resist layer developed to leave the masking elements on the metal brush layer, and the pattern transferred to the metal brush layer, in accordance with an embodiment of the present invention.

In one or more embodiments, the pattern of the masking elements 140 can be transferred to the underlying metal brush layer 120 using etching processes, for example, dry plasma etching and/or selective direction etching (e.g., reactive ion etching (RIE)). Portions of the metal brush layer 120 can be removed to expose the underlying substrate, including the OPL. The pattern may be transferred to the OPL using further etching and brush layer elements 125 as a mask.

Figure 5:
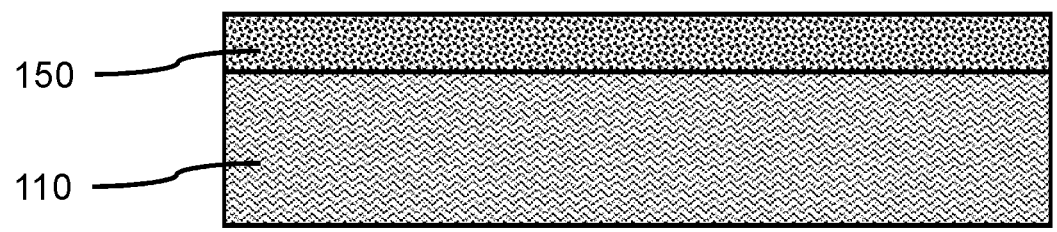
FIG. 5 is a cross-sectional side view showing a hardmask layer on a substrate, in accordance with another embodiment of the present invention.

FIG. 5 is a cross-sectional side view showing a hardmask layer on a substrate, in accordance with another embodiment of the present invention.

In one or more embodiments, a hardmask layer 150 can be formed on the substrate 110, where the hardmask layer 150 can be formed by various deposition methods, including, but not limited to, chemical vapor deposition (CVD), physical vapor deposition (PVD), atomic layer deposition (ALD), plasma enhanced version of ALD (PEALD) and CVD (PECVD), and combinations thereof.

In various embodiments, the hardmask layer 150 can be a semiconductor compound, including, but not limited to, silicon oxide (SiO), silicon nitride (SiN), silicon oxynitride (SiON), silicon oxycarbide (SiOC); a metal compound, including, but not limited to, titanium nitride (TiN), zirconium nitride (ZrN), hafnium nitride (HfN), tantalum nitride (TaN), titanium oxide (TiO), titanium oxynitride (TiON); and combinations thereof.

In one or more embodiments, the hardmask layer 150 can have a thickness in a range of about 2 nm to about 100 nm, or about 5 nm to about 100 nm, or about 20 nm to about 40 nm, or about 2 nm to about 20 nm, although other thicknesses are also contemplated, where the hardmask layer 150 thickness can be sufficient to enable transfer of the pattern to the underlying substrate 110.

Figure 6:
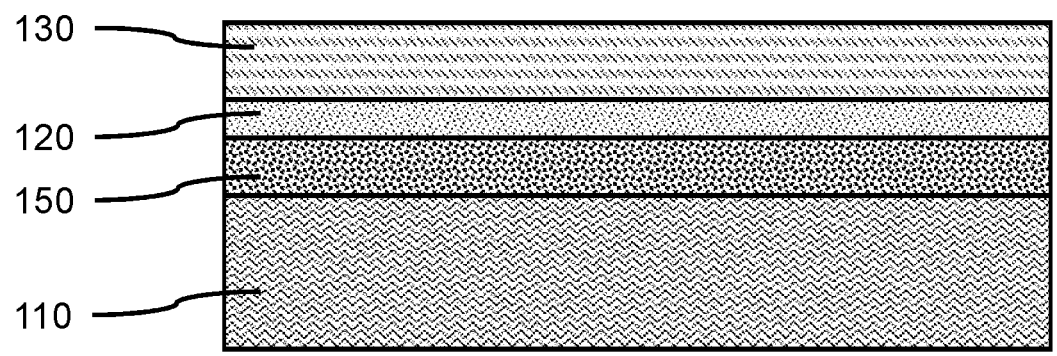
FIG. 6 is a cross-sectional side view showing a metal brush layer on the hardmask layer, and a resist layer on the metal brush layer, in accordance with an embodiment of the present invention.

FIG. 6 is a cross-sectional side view showing a metal brush layer on the hardmask layer, and a resist layer on the metal brush layer, in accordance with an embodiment of the present invention.

In one or more embodiments, a brush layer 120 can be formed on the hardmask layer 150, where the brush layer 120 adheres to the hardmask layer 150. The chemical composition of the brush layer 120 can include grafting units that bond to the hardmask layer 150 through covalent bonds.

In one or more embodiments, a resist layer 130 can be formed on the metal brush layer 120. The metal brush layer 120 on the hardmask layer 150, and the resist layer 130 on the metal brush layer can form an EUV lithography stack.

Figure 7:
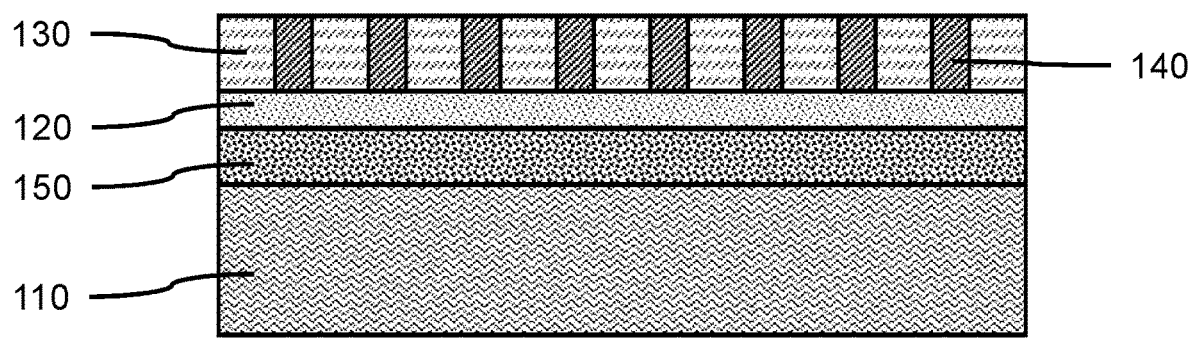
FIG. 7 is a cross-sectional side view showing the resist layer exposed to an extreme ultraviolet (EUV) light source to cause a photoreaction in the resist material, in accordance with another embodiment of the present invention.

FIG. 7 is a cross-sectional side view showing the resist layer exposed to an extreme ultraviolet (EUV) light source to cause a photoreaction in the resist material, in accordance with another embodiment of the present invention.

In one or more embodiments, the resist layer 130 can be exposed to an extreme ultraviolet (EUV) light source to cause a photoreaction in the resist material to form masking elements 140.

Figure 8:
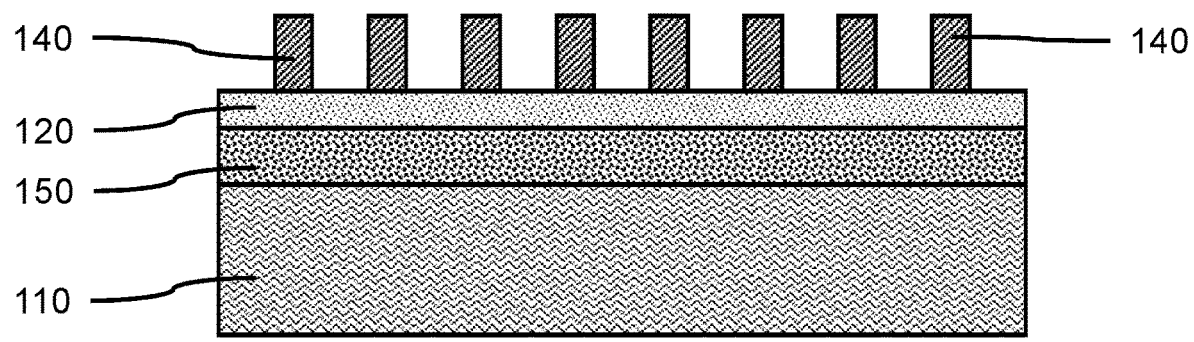
FIG. 8 is a cross-sectional side view showing the patterned resist layer developed to leave the masking elements on the metal brush layer, in accordance with an embodiment of the present invention.

FIG. 8 is a cross-sectional side view showing the patterned resist layer developed to leave the masking elements on the metal brush layer, in accordance with an embodiment of the present invention.

In one or more embodiments, the resist layer 130 can be developed to remove soluble portions of the resist layer, while leaving masking elements 140 on the underlying brush layer 120. Development can use a chemical rinse to remove the soluble portions of the resist layer 130 after exposure.

Figure 9:
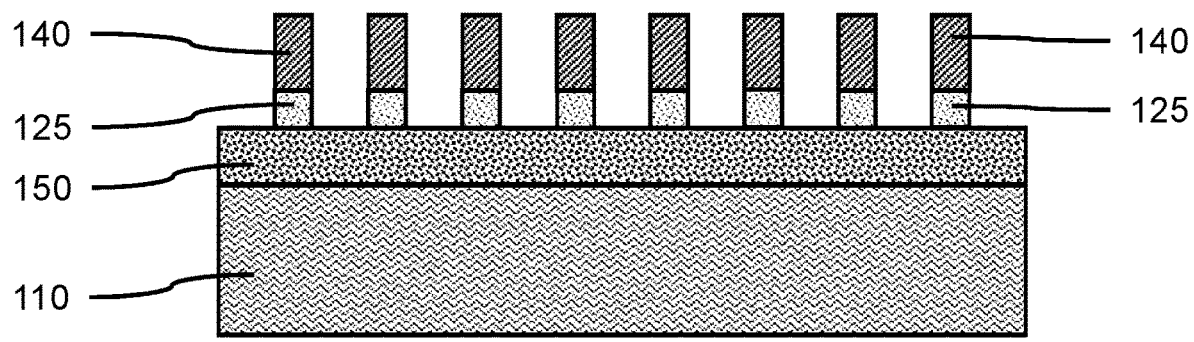
FIG. 9 is a cross-sectional side view showing the pattern transferred to the metal brush layer, in accordance with another embodiment of the present invention.

FIG. 9 is a cross-sectional side view showing the pattern transferred to the metal brush layer, in accordance with another embodiment of the present invention.

In one or more embodiments, the pattern of the masking elements 140 can be transferred to the underlying brush layer 120 by etching.

Figure 10:
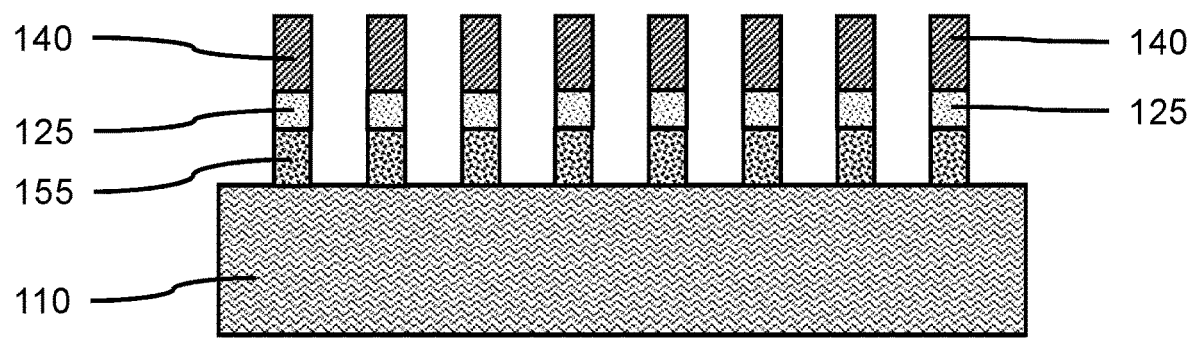
FIG. 10 is a cross-sectional side view showing the pattern transferred to the underlying hardmask layer, in accordance with another embodiment of the present invention.

FIG. 10 is a cross-sectional side view showing the pattern transferred to the underlying hardmask layer, in accordance with another embodiment of the present invention.

In one or more embodiments, the pattern of the masking elements 140 and brush layer elements 125 can be transferred to the underlying hardmask layer by etching (e.g., RIE) to form hardmask elements 155 on the substrate 110. The pattern may be transferred to the OPL by further etching.

Figure 11:
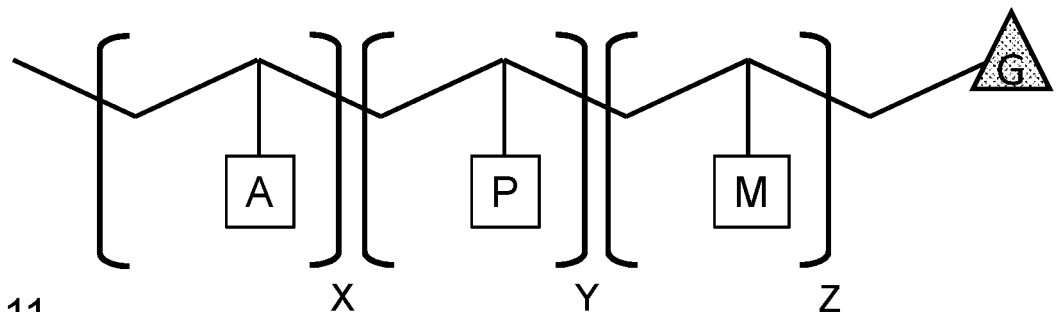
FIG. 11 is a diagram for a chemical structure of a brush layer polymer composition, in accordance with an embodiment of the present invention.

FIG. 11 is a diagram for a chemical structure of a brush layer polymer composition, in accordance with an embodiment of the present invention.

In one or more embodiments, the brush layer 120 can be a polymeric material. In various embodiments, the brush layer 120 can be a block copolymer or a graft copolymer, which can include two or more different pendant moieties attached to the polymer backbone. The pendant moieties can be an adhesion promotor, A, a photo-acid generating moiety, P, a metal-containing moiety, M, or a solubility switch moiety, S. The brush layer polymer can include a grafting unit, G, where the grafting unit can be at an end of the polymer backbone or as a pendent group off of a monomer unit of the polymer backbone, where the monomer unit can be a terminal monomer unit.

In various embodiments, the pendant moieties can be attached to a group that can participate in a polymerization reaction, for example, a vinyl group ($CH_2CH$—).

In various embodiments, the pendant moieties can react with reactive groups on the polymer backbone to form a graft copolymer, where the monomer(s) forming the polymer backbone can be, for example, poly vinyl alcohol $[CHCHOH]_x$, poly vinyl acetate $[CHCHOCOCH_3]_x$, poly 4-vinylphenol $[CHCH(C_6H_4OH)]_x$, poly methyl methacrylate $[CHC(CH_3)(COOCH_3)]x$, and combinations thereof. The moieties grafted onto the backbone of the metal brush layer 120 can react with the alcohol oxygen or carboxyl carbon to attach to the polymer backbone, for example, through a condensation reaction such as esterification.

The adhesion promotor, A, can increase bonding between a metal brush layer and an EUV resist layer, which can be an organic layer overlying the brush layer. Adhesion promoter groups can interact with the resist layer polymer through intermolecular bonding such as Van der Waals forces, hydrogen bonding, pi-pi interactions, and combinations thereof. In various embodiments, the adhesion promotor, A, can be a benzyl (—$C_6H_5$) (e.g., where the brush layer polymer includes polystyrene), hydroxyl styrene (—$C_6H_4OH$) (e.g. where the brush layer polymer includes poly 4-vinylphenol), or methacrylate ($C_5H_8O_2$) (e.g., where the brush layer polymer includes poly-methyl methacrylate (PMMA) ($CH_2$=$C(CH_3)COOCH_3)_n$). For a resist polymer including a high content of styrene or hydroxy styrene based monomers, the adhesion promotor, A, could be matched to also include styrene based monomers to improve interactions. Similar if the resist polymer contained a high fluorine content, then a monomer such as phenyl hexafluroalchol could be included in the metal brush layer polymer. If the resist polymer was methacrylate rich, the brush layer polymer could be include PMMA or other acrylate moeties.

The photo-acid generating moiety, P, can generate hydrogen ions (i.e., H+) in the polymer matrix, which can diffuse away from high concentration regions into neighboring regions to produce acid catalyzed reactions. In various embodiments, the photo-acid generating moiety, P, can be triphenylsulfonium salts (TPS), iodonium salts, such as TPS triflate, diphenyliodonium nitrate, and combinations thereof.

The metal-containing moiety, M, can be a functional group that can chelate with a metal, which can function as a photoactive center. In various embodiments, the metal-containing moiety, M, can be a carboxylic acid moiety (—COOH), a thiol moiety (—R—SH), a mercaptocarboxylic acid moiety (—S—R—COOH), an imidazolyl moiety (—$NC_3H_3N$), a diethylenetriaminyl moiety (—$NHCH_2CH_2NHCH_2CH_2NH_2$), an ethylenediaminyl moiety (—$NHCH_2CH_2NH_2$), a diethanolaminyl moiety (—$OCH_2CH_2NHCH_2CH_2OH$), a pyridinyl moiety (—$C_5H_4N$), where the nitrogen can be located at a meta or para location on the ring.

In various embodiments, the grafting group, G, can be determined based on the functionalization of the surface the metal brush layer is to be applied to, so the brush can be grafted to the surface. Some example of grafting groups that are matched to chemical features on the surface include a vinyl (i.e., ethenyl) (—$CHCH_2$), a primary amine (—$NH_2$), a hydroxyl (—OH), a thiol (—SH), a carboxylic acid (—COOH), a cyano group (—CN), an oxacyclopropane oxirane (—$CHCH_2O$), or a combination thereof. The selection of the grafting group for the copolymer can depend upon the material of the underlying OPL or hardmask to ensure the brush layer forms the interface with the resist layer. Grafting groups, G, can be matched to chemical units on the surface, as follows: alkene or Alkyne grafting groups can bind to Si—H (silane) surfaces; silane groups, for example, triethoxysilane, can bind to surface hydroxyl groups; and phosphonic acids and carboxylic acids can bind to metal oxides at a surface.

In one or more embodiments, the brush layer polymer can be a block or graft copolymer having a block of x repeating units of an adhesion promotor containing monomers, A, bonded to a block of y repeating units of a photo-acid generating containing monomers, P, bonded to a block of z repeating metal-containing containing monomers, M. A grafting unit, G, can be attached directly to the end of the polymer backbone chain. The repeating units of each block of the copolymer can be of the same adhesion promotor containing monomers, A, photo-acid generating containing monomers, P, and metal-containing containing monomers, M.

In various embodiments, the polymers of the brush layer can have a block of x repeating units of an adhesion promotor containing monomers, A, wherein 'x' is in a range of about 5 to about 100, or about 5 to about 20, or about 30 to about 100, although other block lengths are also contemplated. In various embodiments, the adhesion promotor, A, can make up or be attached to about 50% to about 80% of the monomers in the polymer backbone.

In various embodiments, the polymers of the brush layer can have a block of y repeating units of a photo-acid generating containing monomers, P, wherein 'y' is in a range of about 5 to about 40, or about 5 to about 10, or about 20 to about 40, although other block lengths are also contemplated. In various embodiments, the photo-acid generating containing monomers, P, can make up or be attached to about 5% to about 20% of the monomers in the polymer backbone.

In various embodiments, the polymers of the brush layer can have a block of z repeating metal-containing monomers, M, wherein 'z' is in a range of about 5 to about 50, or about 5 to about 20, or about 30 to about 50, although other block lengths are also contemplated. In various embodiments, the metal-containing monomers, M, can make up or be attached to about 5% to about 20% of the monomers in the polymer backbone.

In one or more embodiments, the brush layer may include only a block of metal-containing monomers, M, and a grafting unit, G.

The polymers of the brush layer can have a grafting unit at one end of the polymer backbone, where the polymers of the brush layer are generated using a reversible addition-fragmentation chain transfer or RAFT polymerization.

In various embodiments, the polymers of the brush layer can have a number average molar mass or $M_n$ (also referred to as Number Average Molecular Weight (NAMW)) in a range of about 2,000 grams/mole to about 20,000 grams/mole, or about 5,000 grams/mole to about 20,000 grams/mole, although other weights are also contemplated.

Figure 12:
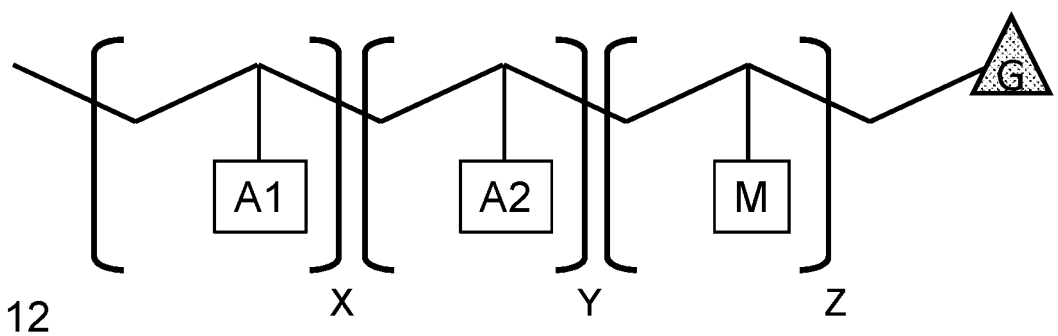
FIG. 12 is a diagram for another chemical structure of a brush layer polymer composition, in accordance with an embodiment of the present invention.

FIG. 12 is a diagram for another chemical structure of a brush layer polymer composition, in accordance with an embodiment of the present invention.

In one or more embodiments, the brush layer polymer can be a block or graft copolymer having a block of x repeating units of a first adhesion promotor containing monomers, A1, bonded to a block of y repeating units of a second adhesion promotor containing monomers, A2, bonded to a block of z repeating metal-containing containing monomers, M, where the first adhesion promotor containing monomers, A1, has a different adhesion promotor moiety than the second adhesion promotor containing monomers, A2. A grafting unit, G, can be a pendent group off of a backbone monomer unit or attached directly to the end of the polymer backbone chain.

In various embodiments, the polymers of the brush layer can have a block of x repeating units of a first adhesion promotor containing monomers, A1, wherein 'x' is in a range of about 5 to about 100, or about 5 to about 20, or about 30 to about 100, although other block lengths are also contemplated.

In various embodiments, the polymers of the brush layer can have a block of y repeating units of second adhesion promotor containing monomers, A2, wherein 'y' is in a range of about 5 to about 100, or about 5 to about 20, or about 30 to about 100, although other block lengths are also contemplated.

In various embodiments, the polymers of the brush layer can have a block of z repeating metal-containing containing monomers, M, wherein 'z' is in a range of about 5 to about 50, or about 5 to about 20, or about 30 to about 50, although other block lengths are also contemplated. In various embodiments, the size of each of the blocks in different polymers of the brush layer can be the same.

Figure 13:
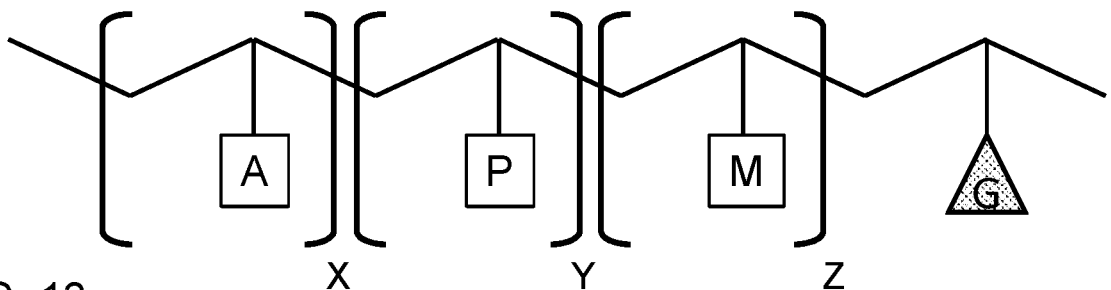
FIG. 13 is a diagram for yet another chemical structure of a brush layer polymer composition, in accordance with an embodiment of the present invention.

FIG. 13 is a diagram for yet another chemical structure of a brush layer polymer composition, in accordance with an embodiment of the present invention.

In one or more embodiments, the brush layer polymer can be a block or graft copolymer having a block of x repeating units of an adhesion promotor containing monomers, A, bonded to a block of y repeating units of a photo-acid generating containing monomers, P, bonded to a block of z repeating metal-containing containing monomers, M. A grafting unit, G, can be attached as a pendent to the last monomer at the end of the polymer backbone chain. The repeating units of each block of the copolymer can be of the same adhesion promotor containing monomers, A, photo-acid generating containing monomers, P, and metal-containing containing monomers, M.

Figure 14:
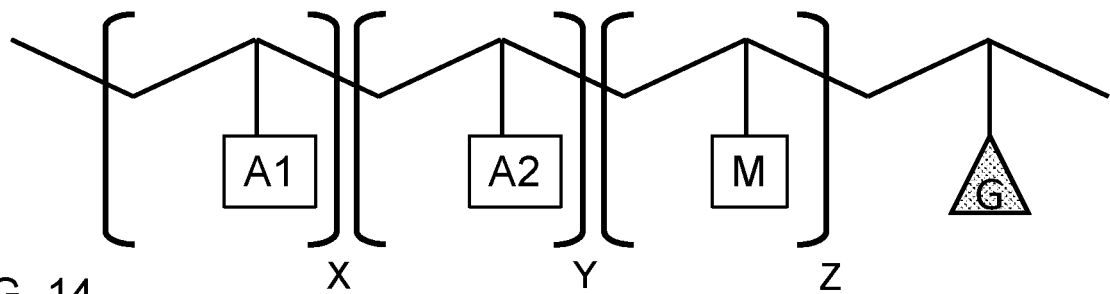
FIG. 14 is a diagram for yet another chemical structure of a brush layer polymer composition, in accordance with an embodiment of the present invention.

FIG. 14 is a diagram for yet another chemical structure of a brush layer polymer composition, in accordance with an embodiment of the present invention.

In one or more embodiments, the brush layer polymer can be a block or graft copolymer having a block of x repeating units of a first adhesion promotor containing monomers, A1, bonded to a block of y repeating units of a second adhesion promotor containing monomers, A2, bonded to a block of z repeating metal-containing containing monomers, M, where the first adhesion promotor containing monomers, A1, has a different adhesion promotor moiety than the second adhesion promotor containing monomers, A2. A grafting unit, G, can be attached as a pendant to the last monomer at the end of the polymer backbone chain.

Figure 15:
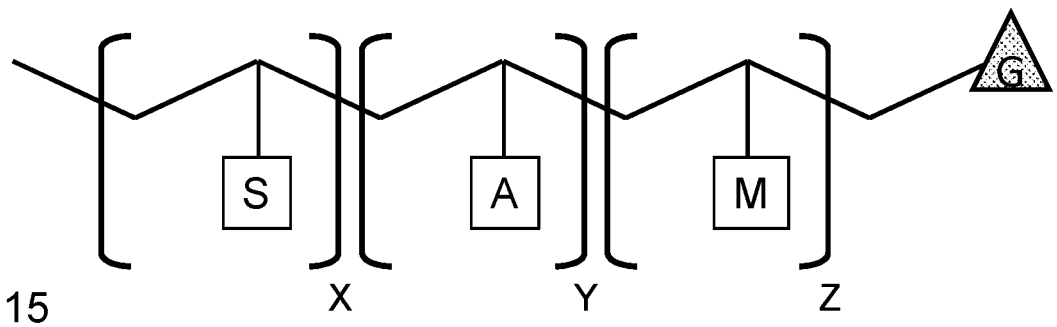
FIG. 15 is a diagram for yet another chemical structure of a brush layer polymer composition, in accordance with an embodiment of the present invention.

FIG. 15 is a diagram for yet another chemical structure of a brush layer polymer composition, in accordance with an embodiment of the present invention.

In one or more embodiments, the brush layer 120 can be a block copolymer or a graft copolymer, which can include two or more different pendant moieties attached to the polymer backbone. In various embodiments, the pendant moieties can be a solubility switch moiety, S, an adhesion promotor moiety, A, a metal-containing moiety, M. The brush layer polymer can include a grafting unit, G, where the grafting unit can be at an end of the polymer backbone.

The solubility switch moiety, S, can be an amine moiety ($-NR^1R^2$), a carboxylic acid moiety ($-COOH$) or phosphonic acid moiety ($-PO(OH)_2$). The solubility switch moiety, S, can change the metal brush layer's solubility in the developer used to remove the soluble portions of the resist layer.

In various embodiments, the solubility switch moiety, S, is an acid cleavable moiety that reacts with the hydrogen ions $H^+$ produced by photo-acid generators in the layers, where cleaving of the solubility switch moieties, S, can cause a change in the solubility of the polymers of the brush layer. The solubility switch moiety, S, can make the metal brush layer more soluble in the resist developer to enable removal of the brush layer during the development of the positive/negative resist layer.

Figure 16:
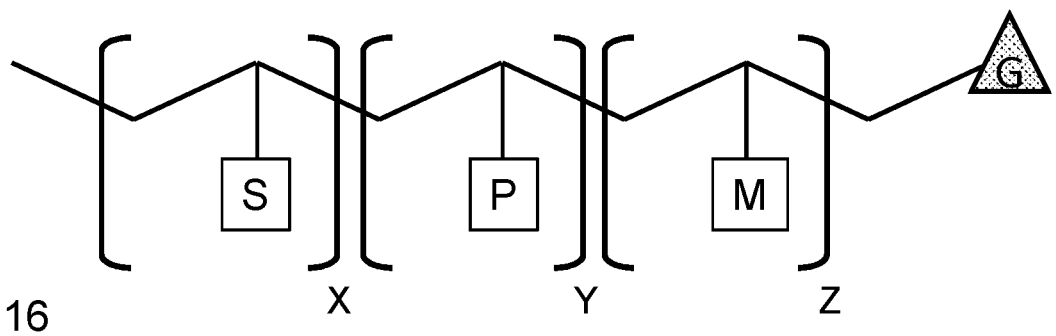
FIG. 16 is a diagram for yet another chemical structure of a brush layer polymer composition, in accordance with an embodiment of the present invention.

FIG. 16 is a diagram for yet another chemical structure of a brush layer polymer composition, in accordance with an embodiment of the present invention.

In one or more embodiments, the brush layer 120 can be a block copolymer or a graft copolymer, which can include two or more different pendant moieties attached to the polymer backbone. In various embodiments, the pendant moieties can be a solubility switch moiety, S, a photo-acid generating moiety, P, a metal-containing moiety, M. The brush layer polymer can include a grafting unit, G, where the grafting unit can be at an end of the polymer backbone.

Figure 17:
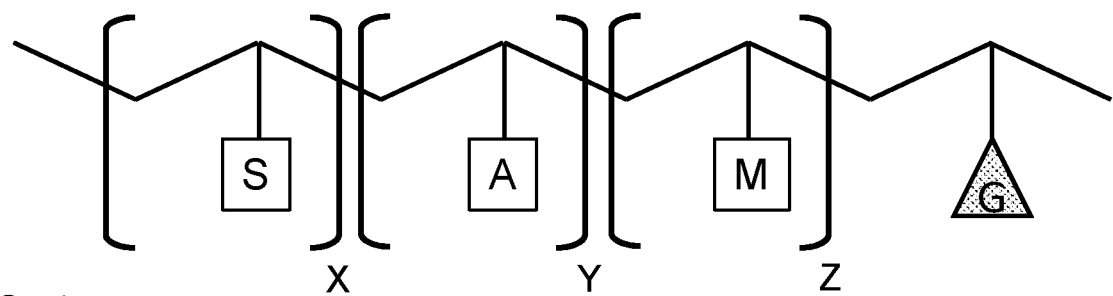
FIG. 17 is a diagram for yet another chemical structure of a brush layer polymer composition, in accordance with an embodiment of the present invention.

FIG. 17 is a diagram for yet another chemical structure of a brush layer polymer composition, in accordance with an embodiment of the present invention.

In one or more embodiments, the brush layer 120 can be a block copolymer or a graft copolymer, which can include two or more different pendant moieties attached to the polymer backbone. In various embodiments, the pendant moieties can be a solubility switch moiety, S, an adhesion promotor moiety, A, a metal-containing moiety, M. The brush layer polymer can include a grafting unit, G, where grafting unit, G, can be attached as a pendant to the last monomer at the end of the polymer backbone chain.

The solubility switch moiety, S, can be an amine moiety ($-NR^1R^2$), a carboxylic acid moiety ($-COOH$), or phosphonic acid moiety (—PO(OH)$_2$). In various embodiments, the solubility switch moiety, S, is an acid cleavable moiety that reacts with the hydrogen ions H$^+$ produced by photo-acid generators in the layers, where cleaving of the solubility switch moieties, S, can cause a change in the solubility of the polymers of the brush layer.

Figure 18:
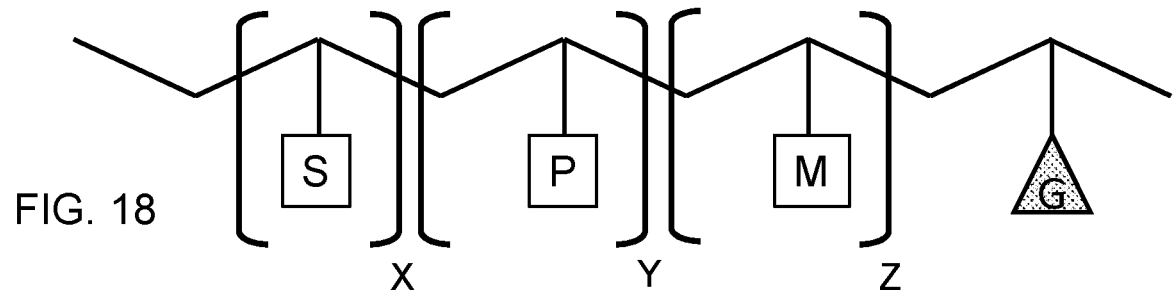
FIG. 18 is a diagram for yet another chemical structure of a brush layer polymer composition, in accordance with an embodiment of the present invention.

FIG. 18 is a diagram for yet another chemical structure of a brush layer polymer composition, in accordance with an embodiment of the present invention.

In one or more embodiments, the brush layer 120 can be a block copolymer or a graft copolymer, which can include two or more different pendant moieties attached to the polymer backbone. In various embodiments, the pendant moieties can be a solubility switch moiety, S, a photo-acid generating moiety, P, a metal-containing moiety, M. The brush layer polymer can include a grafting unit, G, where the grafting unit, U, can be attached as pendant to the last monomer at the end of the polymer backbone chain.

In one or more embodiments, the brush layer polymer can be a random copolymer including an adhesion promotor containing monomers, A, photo-acid generating containing monomers, P, metal-containing containing monomers, M, (i.e., poly A-ran-P-ran-M), and a grafting unit, G. A grafting unit, G, can be attached to a monomer of the polymer backbone, including, directly to the end of the polymer backbone chain. The adhesion promotor containing monomers, A, photo-acid generating containing monomers, P, and metal-containing containing monomers, M can be randomly grafted onto the polymer backbone. The grafting unit, G, can attach the polymers of the metal brush layer to the underlying substrate surface, where a covalent chemical bond can be formed between the brush layer polymers and the substrate.

In one or more embodiments, the brush layer polymer can be a random copolymer including a first adhesion promotor moiety, A1, a second adhesion promotor moiety, A2, a metal-containing moiety, M, and a grafting unit, G, where the first adhesion promotor containing monomers, A1, has a different adhesion promote r moiety than the second adhesion promotor containing monomers, A2, (i.e., poly A1-ran-A2-ran-M). A grafting unit, G, can be attached as a pendant to the last monomer at the end of the polymer backbone chain.

In one or more embodiments, the brush layer 120 can be a random copolymer including a solubility switch moiety, S, an adhesion promoter moiety, A, a metal-containing moiety, (i.e., poly S-ran-P-ran-M), and a grafting unit, G. The brush layer polymer can include a grafting unit, U, can be attached as a pendant to the last monomer at the end of the polymer backbone chain.

In one or more embodiments, the brush layer 120 can be a random copolymer including a solubility switch moiety, S, a photo-acid generating moiety, P, a metal-containing moiety, M, (i.e., poly S-ran-P-ran-M), and a grafting unit, G. The brush layer polymer can include a grafting unit, G, where the grafting unit, G, can be attached as a pendant to the last monomer at the end of the polymer backbone chain.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes Si$_x$Ge$_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprise," "comprising," "includes" and/or "including," when used herein, specify the presence of stated features, integers, steps, operations, elements and/or components, but do not preclude the presence or addition of one or more other features, integers, steps operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it ill also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

Having described preferred embodiments of a system and method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A metal brush layer, comprising:
a polymer backbone including at least one grafting unit, G, attached to the polymer backbone; and
a plurality of metal-containing moieties, M, attached to the polymer backbone.

2. The metal brush layer of claim 1, further comprising a plurality of adhesion promotors, A, attached to the polymer backbone.

3. The metal brush layer of claim 1, further comprising a plurality of photo-acid generating moieties, P, attached to the polymer backbone.

4. The metal brush layer of claim 1, further comprising a plurality of solubility switch moieties, S, attached to the polymer backbone.

5. The metal brush layer of claim 1, further comprising a plurality of adhesion promotors, A, attached to the polymer backbone, wherein the plurality of adhesion promotors, A, occur as a first block along the polymer backbone, and the plurality of metal-containing moieties, M, occur as a second block along the polymer backbone, such that the metal brush layer includes block copolymers.

6. The metal brush layer of claim 5, wherein the grafting unit, G, is a pendent group attached to a terminal monomer unit of the polymer backbone.

7. The metal brush layer of claim 1, further comprising a plurality of adhesion promotors, A, attached to the polymer backbone, wherein the plurality of adhesion promotors, A, and the plurality of metal-containing moieties, M, occur randomly along the polymer backbone, such that the metal brush layer includes random copolymers.

8. The metal brush layer of claim 7, wherein the grafting unit, G, is a pendent group attached to a terminal monomer unit of the polymer backbone.

9. A metal brush layer, comprising:
a polymer backbone including at least one grafting unit, G, attached to a terminal monomer of the polymer backbone;
a plurality of metal-containing moieties, M, attached to the polymer backbone; and
a plurality of first adhesion promotors, A1, attached to the polymer backbone, wherein the plurality of adhesion promotors, A, occur as a first block along the polymer backbone, and the plurality of metal-containing moieties, M, occur as a second block along the polymer backbone.

10. The metal brush layer of claim 9, further comprising a plurality of second adhesion promotors, A2, attached to the polymer backbone, wherein the plurality of second adhesion promotors, A2, occur as a third block along the polymer backbone.

11. The metal brush layer of claim 9, further comprising a plurality of photo-acid generating moieties, P, attached to the polymer backbone, wherein the plurality of photo-acid generating moieties, P, occur as a third block along the polymer backbone.

12. The metal brush layer of claim 9, further comprising a plurality of solubility switch moieties, S, attached to the polymer backbone, wherein the plurality of solubility switch moieties, S, occur as a third block along the polymer backbone.

13. An EUV lithography stack, comprising:
a metal brush layer on a substrate; and
a resist layer on the metal brush layer, wherein the metal brush layer includes a polymer backbone including at least one grafting unit, G, attached to the polymer backbone, and a plurality of metal-containing moieties, M, attached to the polymer backbone.

14. The EUV lithography stack of claim 13, further comprising a hardmask layer between the metal brush layer and the substrate, wherein the metal brush layer is directly attached to the hardmask layer.

15. The EUV lithography stack of claim 13, further comprising a plurality of solubility switch moieties, S, attached to the polymer backbone.

16. The EUV lithography stack of claim 15, further comprising a plurality of photo-acid generating moieties, P, attached to the polymer backbone.

17. The EUV lithography stack of claim 13, further comprising a plurality of first adhesion promotors, A1, attached to the polymer backbone.

18. The EUV lithography stack of claim 17, further comprising a plurality of second adhesion promotors, A2, attached to the polymer backbone.

19. The EUV lithography stack of claim 13, wherein the resist is a polymeric material that is photo-sensitive to EUV light.

20. The EUV lithography stack of claim 19, wherein the substrate includes an organic planarization layer (OPL), and the metal brush layer is directly attached to the organic planarization layer.

\* \* \* \* \*